United States Patent [19]

Ishihara et al.

[11] Patent Number: 4,812,325

[45] Date of Patent: Mar. 14, 1989

[54] METHOD FOR FORMING A DEPOSITED FILM

[75] Inventors: Shunichi Ishihara, Ebina; Junichi Hanna; Isamu Shimizu, both of Yokohama, all of Japan

[73] Assignee: Canon Kabushiki Kaisha, Tokyo, Japan

[21] Appl. No.: 921,197

[22] Filed: Oct. 21, 1986

[30] Foreign Application Priority Data

Oct. 23, 1985 [JP] Japan ........ 60-237005

Oct. 24, 1985 [JP] Japan ........ 60-238496

[51] Int. Cl.$^4$ ........ B05D 5/06; B05D 5/12; C23C 16/00

[52] U.S. Cl. ........ 427/69; 427/70; 427/255; 427/255.3; 437/225; 437/233; 437/234

[58] Field of Search ........ 427/69, 70, 255.3, 255, 427/66, 95, 87, 86, 85, 255.2; 437/225, 233, 234, 245

[56] References Cited

U.S. PATENT DOCUMENTS

| | | | |
|---|---|---|---|
| Re. 31,708 | 10/1984 | Gordon | 427/126.2 |
| 3,306,768 | 2/1967 | Peterson | 117/106 |
| 3,473,978 | 10/1969 | Jackson et al. | 148/175 |
| 3,888,705 | 6/1975 | Fletcher et al. | 148/175 |
| 3,984,587 | 10/1976 | Lipp | 427/255.3 |
| 4,146,657 | 3/1979 | Gordon | 427/126 |
| 4,239,811 | 12/1980 | Kemlage | 427/255.3 |
| 4,357,179 | 11/1982 | Adams et al. | 427/95 |
| 4,402,762 | 9/1983 | John et al. | 427/87 |
| 4,421,592 | 12/1983 | Shaskus et al. | 156/613 |
| 4,448,801 | 5/1984 | Fukuda et al. | 427/87 |
| 4,462,847 | 7/1984 | Thompson et al. | 148/174 |
| 4,504,518 | 3/1985 | Ovshinsky et al. | 427/86 |
| 4,522,663 | 6/1985 | Ovshinsky et al. | 427/86 |
| 4,532,199 | 7/1985 | Ueno et al. | 430/128 |
| 4,554,180 | 11/1985 | Hirooka | 427/248.1 |
| 4,615,905 | 10/1986 | Ovshinsky et al. | 427/86 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/87 |
| 4,652,463 | 3/1987 | Peters | 427/87 |
| 4,657,777 | 4/1987 | Hirooka | 427/39 |
| 4,689,093 | 8/1987 | Ishihara et al. | 437/5 |

FOREIGN PATENT DOCUMENTS

| | | | |
|---|---|---|---|
| 74212 | 3/1983 | European Pat. Off. | 427/255.3 |
| 90586A | 10/1983 | European Pat. Off. | 427/38 |
| 59-199035 | 12/1984 | Japan | 427/38 |
| 60-43819 | 8/1985 | Japan | 427/38 |
| 2038086 | 7/1980 | United Kingdom | 427/87 |
| 2148328A | 5/1985 | United Kingdom | 427/248.1 |

OTHER PUBLICATIONS

Ohnishi et al., Proceedings, 6th E.C. Photovoltaic Solar Energy Conference, London, Apr. 15–19, 1985.

Sakai et al., Proceedings, 6th E.C. Photovoltaic Solar Energy Conference, London, Apr. 15–19, 1985.

Brodsky et al., 22 IBM Technical Disclosure Bulletin 3391 (Jan. 1980).

Inoue, Appl. Phys. Lett. 43(8), Oct. 15, 83, p. 774.

*Primary Examiner*—Sadie Childs

*Attorney, Agent, or Firm*—Fitzpatrick, Cella, Harper & Scinto

[57] ABSTRACT

A method for forming a deposited film comprises introducing into a reaction space containing a substrate (a) a gaseous starting material for the formation of a deposited film, (b) a gaseous oxidizing agent, and optionally (c) a gaseous material containing a valence electron controller component; effecting chemical contact therebetween to form a plurality of precursors including precursors in an excited state; and forming a deposited film on the substrate with at least one of the precursors.

24 Claims, 1 Drawing Sheet

METHOD FOR FORMING A DEPOSITED FILM

BACKGROUND OF THE INVENTION

1. Field of the Invention

This invention relates to a method for the formation of a functional film, particularly a semiconductive deposited film which is useful for uses such as semiconductor device, photosensitive device for electrophotography, electronic device such as optical input sensor device for optical image inputting device, etc.

2. Related Background Art

In the prior art, for functional films, especially amorphous or polycrystalline semiconductor films, individually suitable film forming methods have been employed from the standpoint of desired physical characteristics, uses, etc.

For example, for the formation of silicon deposited films such as amorphous or polycrystalline non-single crystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si (H,X)" when indicating a polycrystalline silicon) (the so-called microcrystalline silicon is included within the category of A-Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in the formation of a silicon type deposited film according to the plasma CVD method which has been generalized in the prior art is considerably complicated as compared with the CVD method of the prior art, and its reaction mechanism involves not a few ambiguous points. Also, there are a large number of parameters for the formation of a deposited film (for example, substrate temperature, flow rate and flow rate ratio of the introduced gases, pressure on the formation, high frequency power, electrode structure, structure of the reaction vessel, speed of evacuation, plasma generating system, etc.). Since such a large number of parameters are combined, the plasma may sometimes become unstable state, whereby marked deleterious influences were exerted frequently on the deposited film formed Besides, the parameters characteristic of the device must be selected for each device and therefore under the present situation it has been difficult to generalize the production conditions.

On the other hand, for the formation of the silicon type deposited film to exhibit sufficiently satisfactory electric and optical characteristics for respective uses, it is now accepted the best to form it according to the plasma CVD method.

However, depending on the application use of the silicon type deposited film, bulk production with reproducibility must be attempted with full satisfaction of enlargement of area, uniformity of film thickness as well as uniformity of film quality, and therefore in the formation of a silicon type deposited film according to the plasma CVD method, enormous installation investment is required for a bulk production device and also management items for such bulk production become complicated, with a width of management tolerance being narrow and the control of the device being severe.

These are pointed as the problems to be improved in the future.

Also, in the case of the plasma CVD method, since plasma is directly generated by high frequency or microwave, etc., in the film forming space in which a substrate on which a film is formed is arranged, electrons or a number of ion species generated may give damages to the film in the film forming process to cause lowering in film quality or non-uniformization of film quality.

For an improvement of this point, the indirect plasma CVD method has been proposed.

The indirect plasma CVD method has elaborated to use selectively the chemical species effective for the film formation by generating plasma with microwave, etc., at an upstream position apart from the film forming space and by transporting said plasma to the film forming space.

However, even by such a plasma CVD method, transport of plasma is essentially required and therefore the chemical species effective for the film formation must have long life, whereby the gas species which can be employed are spontaneously limited, thus failing to give various deposited films. Also, enormous energy is required for the generation of plasma, and the generation of the chemical species effective for the film formation and their amounts cannot be essentially placed under simple management. Thus, various problems remain to be solved.

As contrasted to the plasma CVD method, the optical CVD method is advantageous in that no ion species or electrons are generated which give damages to the film quality on the film formation. However, there are problems such that the light source does not include so much kinds, that the wavelength of the light source tends to be toward UV-ray range, that a large scale light source and its power source are required in the case of industrialization, that the window for permitting the light from the light source to be introduced into the film forming space is coated with a film on the film formation to result in lowering in dose on the film formation, which may further lead to shut-down of the light from the light source into the film forming space.

As described above, in the formation of silicon type deposited films, the points to be solved still remain, and it has been earnestly desired to develop a method for forming a deposited film which is capable of bulk production with saving energy by means of a device of low cost, while maintaining the characteristics and uniformity which are practicably available. Particularly, in the case of the film formation of a semiconductor film of p-, n- or i-type conduction while enhancing the doping effect, the degree of the above requirement is high. These are also applicable for other functional films, for example, semiconductive silicon type films and germanium type films such as silicon nitride films, silicon carbide films, silicon oxide films as the similar problems which should be solved respectively.

SUMMARY OF THE INVENTION

An object of the present invention is to provide a novel method for forming a deposited film with removing the drawbacks of the method for forming deposited films as described above and at the same time without use of the formation method of the prior art.

Another object of the present invention is to provide a method for forming a deposited film capable of saving energy and at the same time obtaining a semiconductive deposited film doped with a valence electron controller having uniform characteristics over a large area with easy management of film quality.

Still another object of the present invention is to provide a method for forming a deposited film by which a film excellent in productivity and bulk productivity, having high quality as well as excellent physical characteristics such as electrical, optical and semiconductor characteristics can be easily obtained.

According to one aspect of the present invention, there is provided a method for forming a deposited film which comprises introducing a gaseous starting material for formation of a deposited film and a gaseous oxidizing agent having the property of oxidation action on said starting material into a reaction space to effect chemical contact therebetween to thereby form a plural number of precursors containing precursors under excited states, and forming a deposited film on a substrate existing in the film forming space with the use of at least one precursor of these precursors as the feeding source for the constituent element of the deposited film.

DETAILED DESCRIPTION OF PREFERRED EMBODIMENTS

Figure 1:
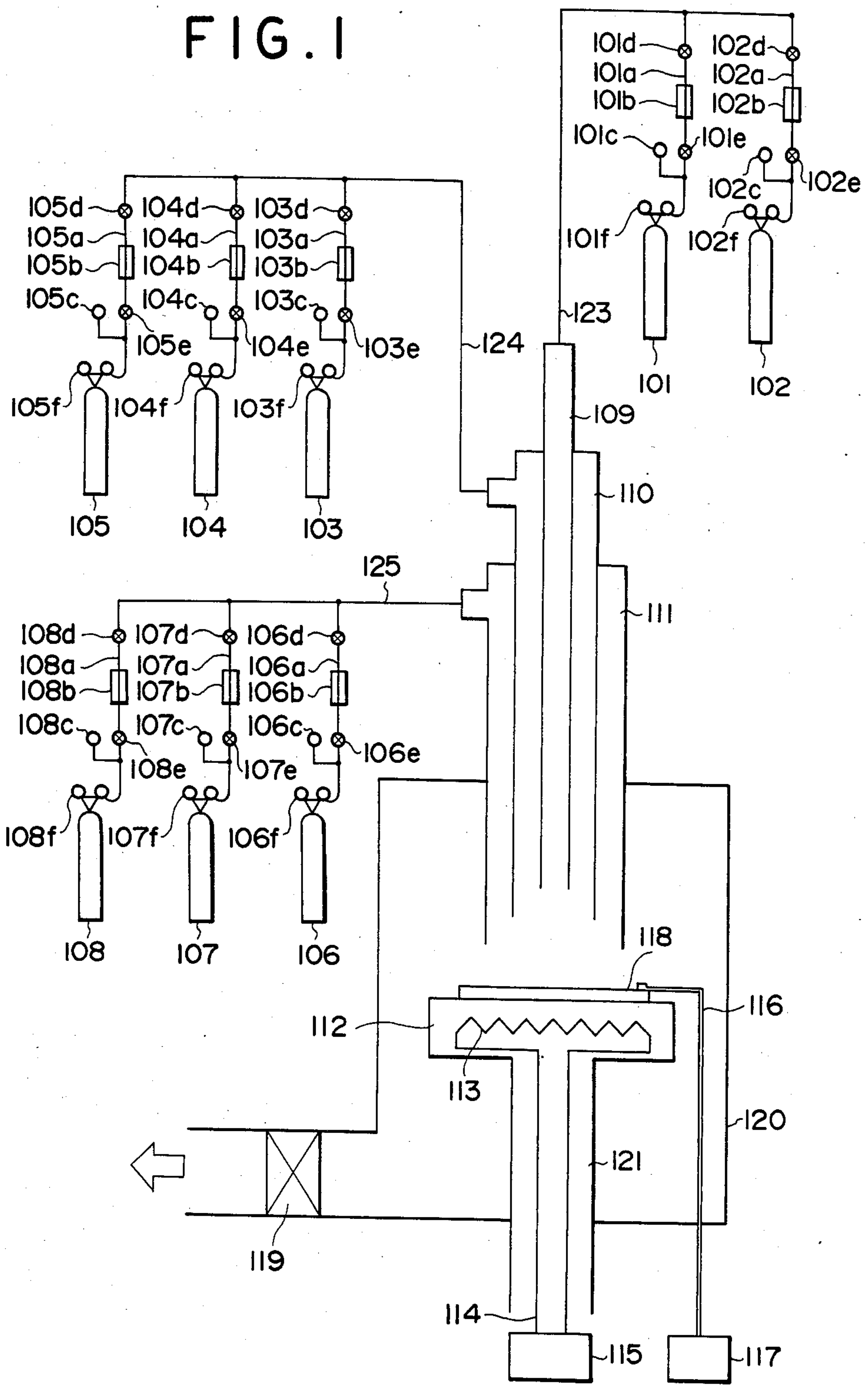
FIG. 1 is a schematic illustration of a film forming device used in Examples of the present invention.

In the method for forming a deposited film of the present invention, the gaseous starting material to be used for the formation of a deposited film receives oxidizing action through chemical contact with a gaseous oxidizing agent and can be selected suitably as desired depending on the kind, the characteristic, use, etc., of the desired deposited film. In the present invention, the above gaseous starting material and the gaseous oxidizing agent may be those which can be made gaseous on the chemical contact, and they can be either liquid or solid as ordinary state.

In the method according to the present invention, if necessary, a gaseous material (D) containing a component for a valence electron controller as the constituent is introduced into a reaction space on the film formation to control the electroconductivity and conduction type, namely, to control valence electrons.

In the method for forming a deposited film of the present invention, the gaseous material (D) to be used and containing a component for a valence electron controller as the constituent receives oxidizing action through chemical contact with a gaseous oxidizing agent and can be selected suitably as desired depending on the kind, the characteristic, use, etc., of the desired deposited film. In the present invention, the above gaseous starting material, the gaseous material (D), and the gaseous oxidizing agent may be those which can be made gaseous on the chemical contact, and they can be either liquid or solid under ordinary state.

When the starting material for the formation of a deposited film, the material (D) or a oxidizing agent is liquid or solid under ordinary state, the starting material for the formation of a deposited film, the material (D), and the oxidizing agent are introduced into the reaction space under gaseous state while performing bubbling with the use of carrier gas such as Ar, He, $N_2$, $H_2$, etc., optionally with application of heat.

During this operation, the partial pressures and mixing ratio of the above gaseous starting material, the material (D), and the gaseous oxidizing agent may be set by controlling the flow rate of the carrier gas and the vapor pressures of the starting material for the formation of the deposited film and the gaseous oxidizing agent.

As the starting material for the formation of a deposited film to be used in the present invention, for example, if tetrahedral type deposited films such as semiconductive silicon type deposited films or germanium type deposited films, etc., are desired to be obtained, straight chain and branched chain silane compounds, cyclic silane compounds, chain germanium compounds, etc., may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, and examples of chain germanium compounds include $Ge_mH_{2m+2}$ (m=1, 2, 3, 4, 5), etc. In addition to these compounds, for example, hydrogenated tin compounds such as $SnH_4$, etc., may be employed together as the starting material for the formation of a deposited film.

Of course, these silicon type compounds and germanium type compounds may be used either as a single kind or as a mixture of two or more kinds.

The oxidizing agent to be used in the present invention is made gaseous when introduced into the reaction space and has the property of effectively oxidizing the gaseous starting material for the formation of a deposited film introduced into the reaction space at the same time by mere chemical contact therewith, including oxygens such as air, oxygen, ozone, etc., oxygen or nitrogen compounds such as $N_2O_4$, $N_2O_3$, $N_2O$, NO, etc., peroxides such as $H_2O_2$ as effective ones.

These oxidizing agents are introduced into the reaction space under gaseous state together with the gases of the starting material for the formation of a deposited film and the above material (D) to be optionally used as described above with desired flow rate and feeding pressure, wherein they are mixed with and collided against the above starting material and the above material (D) to be chemically contacted therewith, thereby oxidizing the above starting material and the above material (D) to generate efficiently a plural kinds of precursors containing precursors under excited states. Of the precursors under excited states and other precursors generated, at least one of them functions as the feeding source for the constitutent element of the deposited film to be prepared.

The precursors generated may undergo decomposition or reaction to be converted other precursors under excited states or to precursors under other excited states, or alternatively in their original forms, if desired, although releasing energy to contact the substrate surface arranged in a film forming space, whereby a deposited film with a three-dimensional network structure is prepared.

As the excited energy level, it is preferable that the precursor under the above excited states should be at an energy level accompanied with luminescence in the process of energy transition to a lower energy level or alternatively changing to another chemical species. By the formation of an activated precursor including the precursor under excited states accompanied with luminescence in such a transition of energy, the deposited film forming process of the present invention proceeds with better efficiency and more saving energy to form a deposited film having uniform and better physical characteristics over the whole film surface.

In the method of the present invention, as the material (D) to be optionally used and containing a component for a valence electron controller as the constituent, it is preferable to select a compound which is in gaseous state under normal temperature and normal pressure or which is readily gasifiable by means of a suitable gasifying device and in gaseous state under the conditions for forming a deposit film.

As the material (D) to be used in the present invention, in the case of a silicon type semiconductor film and a germanium type semiconductor film, there may be employed compounds containing the p type valence electron controller, which functions as the socalled p type impurity, namely an element in the group IIIA of the periodic table such as B, Al, Ga, In, Tl, etc., and the n type valence electron controller which functions as the so called n type impurity, namely an element in the group VA of the periodic table such as N, P, As, Sb, Bi, etc.

Specific examples may include $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc., as effective ones.

For introducing the gas of the above material (D) into the reaction space, it can be previously mixed with the above starting material for the formation of a deposited film as before the introduction, or it can be introduced from independent plural number of gas feeding sources.

In the present invention, so that the deposit film forming process may proceed smoothly to form a film of high quality and having desired physical characteristics, as the film forming factors, the kinds and combination of the starting material for the formation of a deposited film, the material (D), and the oxidizing agent, mixing ratio of these, pressure on mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material for the formation of a deposited film and the gaseous oxidizing agent introduced into the reaction space may be determined suitably as determined in relationship of the film forming factors related among the film forming factors as mentioned above, but it is preferably 1/100 to 100/1, more preferably 1/50-50/1 in terms of flow rate ratio introduced.

The proportion of the gaseous material (D) may be said suitably as desired depending on the kind of the above gaseous starting material and the desired semiconductor characteristics of the deposited film to be prepared, but it is preferably 1/1000000 to 1/10, more preferably 1/100000 to 1/20, optimally 1/100000 to 1/50 based on the above gaseous starting material.

The pressure on mixing at the introduction into the reaction space may be preferably higher in order to enhance the chemical contact among the above gaseous starting material, the gaseous material (D), and the above gaseous oxidizing agent in probability, but it is better to determine the optimum value suitably as desired in view of the reactivity. Although the pressure on mixing may be determined as described above, each of the pressure during introduction may be preferably $1\times10^{-7}$ atm to 10 atm, more preferably $1\times10^{-6}$ atm to 3 atm.

The pressure within the film forming space, namely the pressure in the space in which the substrate on which surfaces are subjected to the film formation is arranged may be set suitably as desired so that the precursors (E) under excited state generated in the reaction space and sometimes the precursors (F) formed as secondary products from said precursors (E) may contribute effectively to the film formation.

The inner pressure in the film forming space, when the film forming space is continuous openly to the reaction space, can be controlled in relationship with the introduction pressures and flow rates of the gaseous starting material for the formation of a deposited film, the above material (D), and the gaseous oxidizing agent in the reaction space, for example, by the application of a contrivance such as differencial evacuation or the use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space is integrally made and the reaction position and the film forming position are only different in space, it is possible to effect differential evacuation or provide a large scale evacuating device having sufficient evacuating capacity as described above.

As described above, the pressure in the film forming space may be determined in the relationship with the introduction pressures of the gaseous starting material, the gaseous material (D), and the gaseous oxidizing agent introduced into the reaction space, but it is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement among the gas introducing inlet, the substrate, and the gas evacuating outlet so that the starting material for the formation of a deposited film, the material (D), and the oxidizing agent may be efficiently and uniformly mixed on the introduction of these into the reaction space, the above precursors (E) may be efficiently generated and the film formation may be adequately done without trouble. A preferable example of the geometric arrangement is shown in FIG. 1.

As the substrate temperature (Ts) on the film formation, it can be set suitably as desired individually depending on the gas species employed and the kinds and the required characteristics of the deposited film to be formed, but, for obtaining an amorphous film, it is preferably from room temperature to 450° C., more preferably from 50° to 400° C. Particularly, for forming a silicon type deposited film having better semiconductor characteristics and photoconductive characteristics, etc., the substrate temperature (Ts) should desirably be made 70° to 350° C. On the other hand, for obtaining a polycrystalline film, it should preferably be 200° to 650° C., more preferably 300° to 600° C.

As the atmosphere temperature (Tat) in the film forming space, it may be determined suitably as desired in relationship with the substrate temperature (Ts) so that the above precursors (E) generated and the above precursors (F) are not changed to unsuitable chemical species for the film formation, and also the above precursors (E) may be efficiently generated.

The substrate to be used in the present invention may be either electroconductive or electrically insulating, provided that it is selected as desired depending on the use of the deposited film to be formed. As the electroconductive substrate, there may be mentioned metals such as NiCr, stainless steel, Al, Cr, Mo, Au, Ir, Nb, Ta, V, Ti, Pt, Pd etc. or alloys thereof.

As insulating substrates, there may be conventionally used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers, and so on. At least one side surface of these substrates is preferably subjected to a treatment for imparting electroconductivity, and it is desirable to provide other layers on the side at which said electroconductive treatment has been applied.

For example, an electroconductive treatment of a glass can be carried out by providing a thin film of NiCr, Al, Cr, Mo, Au, Ir, Nb, Ta, V, Ti, Pt, Pd, $In_2O_3$, $SnO_2$, ITO ($In_2O_3+SnO_2$), etc., thereon. Alternatively, a synthetic resin film such as polyester film can be subjected to the electroconductive treatment on its surface by the vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by a laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strains may be created within the film to give sometimes no film of good quality, and therefore it is preferable to use a substrate so that the difference in thermal expansion between both is small.

Also, the surface state of the substrate is directly related to the structure (orientation) of the film or generation of a stylet structures, and therefore it is desirable to treat the surface of the substrate so as to give a film structure and a film texture for obtaining desired characteristics.

FIG. 1 shows an example of a preferable device for practicing the method for forming a deposited film of the present invention.

The deposited film forming device shown in FIG. 1 is broadly classified into a main device, an evacuation system, and a gas feeding system.

In the main device, a reaction space and a film forming space are provided.

101–108 are respectively bombs filled with the gases to be used in the film formation, 101*a*–108*a* are respectively gas feeding pipes, 101*b*–108*b* are respectively mass flow controllers for controlling the flow rates of the gases from the respective bombs, 101*c*–108*c* are respectively gas pressure gauges, 101*d*–108*d* and 101*e*–108*e* are respectively valves, and 101*f*–108*f* are respectively pressure gauges indicating the pressures in the corresponding gas bombs.

120 is a vacuum chamber equipped with a pipeline for a gas introduction at the upper portion, having a structure for the formation of the reaction space down stream of the pipeline, and also having a structure for the formation of a film forming space in which a substrate holder 112 is provided so that a substrate 118 may be provided as opposed to the gas discharging outlet of said pipeline. The pipeline for the gas introduction has a triple concentric arrangement structure, having from the innerside a first gas introducing pipe 109 for introducing the gases from the gas bombs 101, 102, a second gas introducing pipe 110 for introducing the gases from the gas bombs 103–105, and a third gas introducing pipe 111 for introducing the gases from the gas bombs 106–108.

For the gas evacuation to the reaction space of each gas introducing pipe, its position is designed so as to be arranged at a position farther from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123–125, respectively.

The respective gas introducing pipes, the respective gas feeding pipe lines, and the vacuum chamber 120 are evacuated to vacuum through the main vacuum valve 119 by means of a vacuum evacuating device not shown in this figure.

The substrate 118 is set at a suitable desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film to be prepared, the gas flow rates, the inner pressure in the vacuum chamber, etc., but it is preferably several mm to 20 cm, more preferably 5 mm to about 15 cm.

113 is a heater for heating the substrate which is provided in order to heat the substrate to an appropriate temperature during the film formation, or preheating the substrate 118 before the film formation, or further to anneal the film after the film formation.

The substrate heating heater 113 is supplied with power through a conductive wire 114 from a power source 115.

116 is a thermocouple for measuring, the substrate temperature (Ts) and is electrically connected to the temperature display device 117.

The present invention described in more detail by referring to the following Examples.

EXAMPLE 1

By the use of the film forming device shown in FIG. 1, a deposited film was prepared according to the process of the present invention as described below.

The $SiH_4$ gas filled in the bomb 101 was introduced at a flow rate of 20 sccm through the gas introducing pipe 109, the $O_2$ gas filled in the bomb 106 at a flow rate of 2 sccm and the He gas filled in the bomb 107 at a flow rate of 40 sccm through the gas introducing pipe 111 into the vacuum chamber 120.

During this operation, the pressure in the vacuum chamber 120 was made 100 mTorr by controlling the opening of the vacuum valve 119. A quartz glass (15 cm×15 cm) was used for the substrate, and the distance between the gas introducing inlet 111 and the substrate was set at 3 cm. Blueish white luminescence was strongly observed in the mixing region of $SiH_4$ gas and $O_2$ gas. The substrate temperature (Ts) was set at from room temperature to 400° C. for respective samples as indicated in Table A-1.

When gases were permitted to flow under such conditions for 3 hours, Si:O:H films having film thicknesses as shown in Table A-1 were deposited on the substrate.

TABLE A-1

| Sample No. | 1-1 | 1-2 | 1-3 | 1-4 | 1-5 |
|---|---|---|---|---|---|
| Substrate temperature (°C.) | 50 | 100 | 250 | 350 | 450 |
| Film thickness (μm) | 0.4 | 0.3 | 0.3 | 0.25 | 0.25 |

Next, when the substrate temperature was fixed at 300° C., and the flow rate of $SiH_4$ was varied, the respective samples prepared were found to have the film thicknesses shown in Table A-2.

The gas was flowed for 3 hours for each sample, and the $O_2$ gas flow rate was made 2 sccm, and the He gas flow rate 40 sccm, and the inner pressure 100 mTorr for each sample.

TABLE A-2

| Sample No. | 1-6 | 1-7 | 1-8 | 1-9 | 1-10 |
|---|---|---|---|---|---|
| $SiH_4$ flow rate (sccm) | 5 | 10 | 20 | 40 | 80 |
| Film thickness (Å) | 500 | 1000 | 2500 | 2750 | 2750 |

Next, the substrate temperature was set at 300° C., $SiH_4$ gas flow rate at 20 sccm, $O_2$ gas flow rate at 2 sccm and the inner pressure at 100 mTorr, and the He gas flow rate was varied variously. The respective samples obtained after flowing the respective gases for 3 hours were found to have the film thicknesses shown in Table A-3.

TABLE A-3

| Sample No. | 1-11 | 1-12 | 1-13 | 1-14 | 1-15 | 1-16 |
|---|---|---|---|---|---|---|
| He flow rate (sccm) | 0 | 5 | 10 | 20 | 40 | 80 |
| Film thickness (Å) | 500 | 1500 | 2500 | 2500 | 2500 | 2500 |

Next, the substrate temperature was set at 300° C., $SiH_4$ gas flow rate at 20 sccm, $O_2$ gas flow rate at 2 sccm, and He gas flow rate at 10 sccm, and the inner pressure was varied variously. The respective samples were found to have the film thicknesses shown in Table A-4.

TABLE A-4

| Sample No. | 1-17 | 1-18 | 1-19 | 1-20 | 1-21 |
|---|---|---|---|---|---|
| Inner pressure | 10 m Torr | 100 m Torr | 1 Torr | 10 Torr | 100 Torr |
| Film thickness (Å) | 1000 | 2500 | 2500 | 2000 | 2000 |

The distribution irregularity of the film thickness of the respective samples shown in Table A-1 to Table A-4 was found to be dependent on the distance between the gas introducing pipe 111 and the substrate, the gas flow rates flowed through the gas introducing pipes 109 and 111, and the inner pressure. In each film formation, the distribution irregularity of the film thickness could be controlled within ±5% for the substrate of 15 cm×15 cm by controlling the distance between the gas introducing pipe and the substrate. This position was found to correspond to the position of the maximum luminescence intensity in most cases. Also, the Si:O:H film formed in every sample was confirmed to be amorphous from the result of the electron beam diffraction.

Also, a sample for the measurement of electroconductivity was prepared by the vapor deposition of a comb-shaped aluminum electrode (gap length: 200 μm) on the amorphous Si:O:H films of each sample. Each sample was placed in a vacuum cryostat, and the dark electroconductivity (σd) was attempted to determine by applying a voltage of 100V and measuring the current by means of a minute amperemeter (YHP4140B), but it was found to be smaller than the measurable limit in every case. Thus, the dark electroconductivity at room temperature was estimated to be $10^{-14}$ s/cm or less.

EXAMPLE 2

The film formation was conducted by introducing $N_2O_4$ gas from the 107 bomb in place of the introduction of $O_2$ gas in Example 1 (Sample 2A). The film forming conditions in this case are as follows:

$SiH_4$ 20 sccm
$N_2O_4$ 2 sccm
He 40 sccm
Inner pressure 100 mTorr
Substrate temperature 300° C.
Distance between gas blowing outlet and substrate 3 cm Similarly as in Example 1, strong blue luminescence was observed in the region where $SiH_4$ gas and $N_2O_4$ gas were merged into one stream. After gas blowing for 3 hours, an A-Si:N:O:H film of about 3500 Å thickness was deposited on the quartz glass substrate.

This film was found to be amorphous as confirmed by the electron beam diffraction.

After an aluminum comb-shaped electrode (gap length 200 μm) was vapor deposited in vacuo on the A-Si:N:O:H film, the sample was placed in a vacuum cryostat, and the dark electroconductivity (σd) was measured similarly as in Example 1, but it was found to be smaller than the measurable limit.

EXAMPLE 3

In Example 1, the film formation was conducted by introducing $Si_2H_6$ gas from the 103 bomb in place of introducing $SiH_4$ gas (Sample 3A).

The film forming conditions in this case are as follows:

| | |
|---|---|
| $Si_2H_6$ | 20 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Si:O:H film of about 5000 Å thickness was deposited on the quartz glass substrate.

This film was confirmed to be amorphous by the electron beam diffraction.

After an aluminum comb-shaped electrode (gap length 200 μm) was vapor deposited in vacuo on the A-Si:O:H film, the sample was placed in a vacuum cryostat, and the dark electroconductivity (σd) was measured, but it was smaller than the measurable limit similarly as in Example 1.

EXAMPLE 4

In Example 1, the film formation was conducted by introducing $GeH_4$ gas from the 104 bomb in place of introducing $SiH_4$ gas (Sample 4A).

The film forming conditions in this case are as follows:

| | |
|---|---|
| $GeH_4$ | 20 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Ge:O:H film of about 3000 Å thickness was deposited on the quartz glass substrate. This film was confirmed to be amorphous by the electron beam diffraction.

After an aluminum comb-shaped electrode (gap length 200 μm) was vapor deposited in vacuo on the A-Ge:O:H film, the sample was placed in a vacuum cryostat, and the dark electroconductivity (σd) was measured, but it was smaller than the measurable limit similarly as in Example 1.

EXAMPLE 5

In Example 1, the film formation was conducted by introducing $GeH_4$ gas from the 104 bomb simultaneously with the introduction of $SiH_4$ gas (Sample 5A).

The film forming conditions in this case are as follows:

| | |
|---|---|
| $SiH_4$ | 20 sccm |
| $GeH_4$ | 5 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-SiGe:O:H film of about 5000 Å thickness was deposited on the quartz glass substrate. This film was confirmed to be amorphous by the electron beam diffraction.

After an aluminum comb-shaped electrode (gap length 200 μm) was vapor deposited in vacuo on the A-SiGe:O:H film, the sample 5A was placed in a vacuum cryostat, and the dark electroconductivity (σd) was measured, but it was found to be smaller than the measurable limit similarly as in Example 1.

EXAMPLE 6

In Example 5, the film formation was conducted by introducing $C_2H_4$ gas from the 105 bomb in place of the introduction of $GeH_4$ gas (Sample 6A).

The film forming conditions in this case are as follows:

| | |
|---|---|
| $SiH_4$ | 20 sccm |
| $C_2H_4$ | 5 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-SiC:O:H film of about 1.0 μm thickness was deposited on the quartz glass substrate. This film was confirmed to be amorphous by the electron beam diffraction.

After an aluminum comb-shaped electrode (gap length 200 μm) was vapor deposited in vacuo on the A-SiC:O:H film, the sample 6A was placed in a vacuum cryostat, and the dark electroconductivity (σd) was measured, but it was found to be smaller than the measurable limit similarly as in Example 1.

EXAMPLE 7

In Example 1, the film formation was conducted by introducing $Si_2H_6$ gas from the 103 bomb simultaneously with introduction of $SiH_4$ gas (Sample 7A).

The film forming conditions in this case are as follows:

| | |
|---|---|
| $SiH_4$ | 20 sccm |
| $Si_2H_6$ | 5 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Si:O:H film of about 5500 Å thickness was deposited on the quartz glass substrate. This film was confirmed to be amorphous by the electron beam diffraction.

After an alumimum comb-shaped electrode (gap length 200 μm) was vapor deposited in vacuo on the A-Si:O:H film, the sample 7A was placed in a vacuum cryostat, and the dark electroconductivity (σd) was measured, but it was found to be smaller than the measurable limit similarly as in Example 1.

EXAMPLE 8

In Example 7, the film formation was conducted by introducing $N_2O_4$ gas from the 107 bomb in place of introduction of $O_2$ gas (Sample 8A).

The film forming conditions in this case are as follows:

| | |
|---|---|
| $SiH_4$ | 20 sccm |
| $Si_2H_6$ | 5 sccm |
| $N_2O_4$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Si:N:O:H film of about 6000 Å thickness was deposited on the quartz glass substrate. This film was confirmed to be amorphous by the electron beam diffraction.

After an aluminum comb-shaped electrode (gap length 200 μm) was vapor deposited in vacuo on the A-Si:N:0:H film, the sample 8A was placed in a vacuum cryostat, and the dark electroconductivity (σd) was measured, but it was found to be smaller than the measurable limit similarly as in Example 1.

EXAMPLE 9

In Example 1, the film formation was conducted by introducing $SnH_4$ gas from the 102 bomb in place of introduction of $SiH_4$ gas (Sample 9A).

The film forming conditions in this case are as follows:

| | |
|---|---|
| $SnH_4$ | 10 sccm |
| $O_2$ | 20 sccm |
| He | 40 sccm |
| Inner pressure | 100 mTorr |
| Substrate temperature | 300° C. |
| Distance between gas blowing outlet and substrate | 4 cm |

After gas blowing for 3 hours, a Sn:O:H film of about 1.0 μm thickness was deposited on the quartz glass substrate. This film was confirmed to be polycrystalline, since diffraction peak was observed as confirmed by the electron beam diffraction.

After an aluminum comb-shaped electrode (gap length 200 μm) was vapor deposited in vacuo on the poly-Sn:O:H film, the sample was placed in a vacuum cryostat, similarly as in Example 1, and the dark electroconductivity (σd) was measured.

The obtained value was as follows:

$$od = 3 \times 10^{-4}\ s/cm$$

EXAMPLE 10

In Example 1, the film formation was conducted by setting the substrate temperature at 600° C. (Sample 10A).

The film forming conditions in this case are as follows:

| | |
|---|---|
| $SiH_4$ | 20 sccm |
| $O_2$ | 2 sccm |
| He | 40 sccm |
| Inner pressure | 100 mTorr |
| Distance between gas blowing outlet and substrate | 3 cm |

After gas blowing for 3 hours, an Si:O:H film of about 200 Å thickness was deposited on the quartz glass substrate. When the deposited film was measured by the electron beam diffraction, diffraction peak of $SiO_2$ was observed to indicate that it was polycrystallized.

After an aluminum comb-shaped electrode (gap length 200 μm) was vapor deposited in vacuo on the poly-Si:O:H film, the sample 10A was placed in a vacuum cryostat, and the dark electroconductivity (σd) was measured, but it was found to be smaller than the measurable limit similarly as in Example 1.

EXAMPLE 11

By the use of the film forming device shown in FIG. 1, a deposited film was prepared according to the process of the present invention as described below.

The $SiH_4$ gas filled in the bomb 101 was introduced at a flow rate of 20 sccm through the gas introducing pipe 109, the $B_2H_6$ gas (diluted with $H_2$ gas to 1%) filled in the bomb 104 at a flow rate of 2 sccm through the gas introducing pipe 110, the $O_2$ gas filled in the bomb 106 at a flow rate of 2 sccm and the He gas filled in the bomb 108 at a flow rate of 40 sccm through the gas introducing pipe 111 into the vacuum chamber 120.

During this operation, the pressure in the vacuum chamber 120 was made 100 mTorr by controlling the opening of the vacuum valve 119. A quartz glass (15 cm×15 cm) was used for the substrate, and the distance between the gas introducing inlet 111 and the substrate was set at 3 cm. Blueish white luminescence was strongly observed in the mixing region of $SiH_4$ gas and $O_2$ gas. The substrate temperature (Ts) was set at from room temperature to 400° C. for respective samples as indicated in Table B-1.

When gases were permitted to flow under such conditions for 3 hours, Si:O:H:B films having film thicknesses as shown in Table B-1 were deposited on the substrate.

TABLE B-1

| Sample No. | 11-1 | 11-2 | 11-3 | 11-4 | 11-5 |
|---|---|---|---|---|---|
| Substrate temperature (°C.) | 50 | 100 | 250 | 350 | 450 |
| Film thickness (μm) | 0.5 | 0.4 | 0.4 | 0.3 | 0.3 |
| σd (s/cm) | $2 \times 10^{-12}$ | $3 \times 10^{-11}$ | $6 \times 10^{-11}$ | $4 \times 10^{-11}$ | $8 \times 10^{-11}$ |

Next, when the substrate temperature was fixed at 300° C., and the flow rate of $SiH_4$ was varied, the respective samples prepared were found to have the film thicknesses shown in Table B-2.

The gas was flowed for 3 hours for each sample, and the $B_2H_6$ gas flow rate (diluted with $H_2$ gas to 1%) was made 2 sccm the $O_2$ gas flow rate 2 sccm, the He gas flow rate 40 sccm, and the inner pressure 100 mTorr for each sample.

TABLE B-2

| Sample No. | 11-6 | 11-7 | 11-8 | 11-9 | 11-10 |
|---|---|---|---|---|---|
| $SiH_4$ flow rate (sccm) | 5 | 10 | 20 | 40 | 80 |
| Film thickness (Å) | 700 | 1500 | 3000 | 2900 | 3000 |
| σd (s/cm) | $7 \times 10^{-11}$ | $3 \times 10^{-11}$ | $4 \times 10^{-11}$ | $6 \times 10^{-11}$ | $1 \times 10^{-11}$ |

Next, the substrate temperature was set at 300° C., $SiH_4$ gas flow rate at 20 sccm, the $B_2H_6$gas (diluted with $H_2$ gas to 1%) flow rate at 2 sccm $O_2$ gas flow rate at 2 sccm, and the inner pressure at 100 mTorr, and the He gas flow rate was varied variously. The respective samples obtained after flowing the respective gases for 3 hours were found to have the film thicknesses shown in Table B-3.

TABLE B-3

| Sample No. | 11-11 | 11-12 | 11-13 | 11-14 | 11-15 | 11-16 |
|---|---|---|---|---|---|---|
| He flow rate (sccm) | 0 | 5 | 10 | 20 | 40 | 80 |
| Film thickness (Å) | 700 | 2000 | 3000 | 3000 | 3000 | 3000 |
| $\sigma d$ (s/cm) | $8 \times 10^{-11}$ | $7 \times 10^{-11}$ | $8 \times 10^{-11}$ | $5 \times 10^{-11}$ | $4 \times 10^{-11}$ | $5 \times 10^{-11}$ |

Next, the substrate temperature was set at 300° C., $SiH_4$ gas flow rate at 20 sccm, $B_2H_6$ gas (diluted with $H_2$ gas to 1%) flow rate at 2 sccm, $O_2$ gas flow rate at 2 sccm, and He gas flow rate at 10 sccm, and the inner pressure was varied variously.

The respective samples were found to have film thicknesses shown in Table B-4.

TABLE B-4

| Sample No. | 11-17 | 11-18 | 11-19 | 11-20 | 11-21 |
|---|---|---|---|---|---|
| Inner pressure | 10 m Torr | 100 m Torr | 1 Torr | 10 Torr | 100 Torr |
| Film thickness (Å) | 1000 | 3000 | 3000 | 2500 | 2000 |
| $\sigma d$ (s/cm) | $3 \times 10^{-11}$ | $4 \times 10^{-11}$ | $2 \times 10^{-11}$ | $8 \times 10^{-11}$ | $1 \times 10^{-11}$ |

The distribution irregularity of the film thickness of the respective samples shown in Table B-1 to Table B-4 was found to be dependent on the distance between the gas introducing pipe 111 and the substrate, the gas flow rates flowed through the gas introducing pipes 109, 110, and 111, and the inner pressure. In each film formation, the distribution irregularity of the film thickness could be controlled within ±5% for the substrate of 15 cm×15 cm by controlling the distance between the gas introducing pipe and the substrate. This position was found to correspond to the position of the maximum luminescence intensity in most cases. Also, the Si:O:H:B film formed in every sample was confirmed to be amorphous from the result of the electron beam diffraction.

Also, a sample for the measurement of electroconductivity was prepared by the vapor deposition of a comb-shaped aluminum electrode (gap length: 200 μm) on the amorphous Si:O:H:B films of each sample. Each sample was placed in a vacuum cryostat, and the dark electroconductivity ($\sigma d$) was attempted to determine by applying a voltage of 100V and measuring the current by means of a minute amperemeter (YHP4140B) to obtain the results shown in Table B-1 to Table B-4. All of the samples exhibited P type conductivity by the measurement of thermal electromotive force.

EXAMPLE 12

The film formation was conducted by introducing $N_2O_4$ gas from the 107 bomb in place of the introduction of $O_2$ gas in Example 11 (Sample 2B).

The film forming conditions in this case are as follows:

| | |
|---|---|
| $SiH_4$ | 20 sccm |
| $N_2O_4$ | 2 sccm |
| $B_2H_6$ (1% $H_2$ dilution) | 2 sccm |
| He | 40 sccm |
| Inner pressure | 100 mTorr |
| Substrate temperature | 300° C. |
| Distance between gas blowing outlet and substrate | 3 cm |

-continued

Similarly as in Example 11, strong blue luminescence was observed in the region where $SiH_4$ gas and $N_2O_4$ gas were merged into one stream. After gas blowing for 3 hours, an A-Si:N:O:H:B film of about 3000 Å thickness was deposited on the quartz glass substrate.

This film was found to be amorphous as confirmed by the electron beam diffraction.

After an aluminum comb-shaped electrode (gap length 200 μm) was vapor deposited in vacuo on the A-Si:N:O:H:B film, the sample was placed in a vacuum cryostat, and the dark electroconductivity ($\sigma d$) was measured similarly as in Example 11 to obtain a value of $\sigma d = 3 \times 10^{-12}$ s/cm. Also, by the measurement of thermal electromotive force, the film was found to be P type conductive.

EXAMPLE 13

In Example 11, the film formation was conducted by introducing $Si_2H_6$ gas from the 103 bomb in place of introducing $SiH_4$ gas (Sample 3B).

The film forming conditions in this case are as follows:

| | |
|---|---|
| $Si_2H_6$ | 20 sccm |
| $B_2H_6$ (1% $H_2$ dilution) | 2 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Si:O:H:B film of about 6000 Å thickness was deposited on the quartz glass substrate. This film was confirmed to be amorphous by the electron beam diffraction.

After an aluminum comb-shaped electrode (gap length 200 μm) was vapor deposited in vacuo on the A-Si:O:H:B film, the sample was placed in a vacuum cryostat, and the dark electroconductivity ($\sigma d$) was measured to obtain $\sigma d = 8 \times 10^{-11}$ s/cm. The result of the measurement of thermal electromotive force exhibited P type.

EXAMPLE 14

In Example 11, the film formation was conducted by introducing $GeH_4$ gas from the 105 bomb in place of introducing $SiH_4$ gas (Sample 4B).

The film forming conditions in this case are as follows:

| | |
|---|---|
| $GeH_4$ | 20 sccm |
| $B_2H_6$ (1% $H_2$ dilution) | 2 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Ge:O:H:B film of about 3500 Å thickness was deposited on the quartz glass substrate. This film was confirmed to be amorphous by the electron beam diffraction.

After an aluminum comb-shaped electrode (gap length 200 μm) was vapor deposited in vacuo on the A-Ge:O:H:B film, the sample was placed in a vacuum cryostat, and dark electroconductivity (σd) was measured to obtain $\sigma d = 9 \times 10^{-11}$ s/cm. Also, the result of the measurement of thermal electromotive force exhibited P type.

EXAMPLE 15

In Example 11, the film formation was conducted by introducing $GeH_4$ gas from the 105 bomb simultaneously with the introduction of $SiH_4$ gas (Sample 5B).

The film forming conditions in this case are as follows:

| | |
|---|---|
| $SiH_4$ | 20 sccm |
| $GeH_4$ | 5 sccm |
| $B_2H_6$ (1% $H_2$ dilution) | 3 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-SiGe:O:H:B film of about 6000 Å thickness was deposited on the quartz glass substrate. This film was confirmed to be amorphous by the electron beam diffraction.

After an aluminum comb-shaped electrode (gap length 200 μm) was vapor deposited in vacuo on the A-SiGe:O:H:B film, the sample 5B was placed in a vacuum cryostat and the dark electroconductivity (σd) was measured to obtain a value of $\sigma d = 3 \times 10^{-10}$ s/cm. From the measurement result of thermal electromotive force, the film was found to be P type conductive.

EXAMPLE 16

In Example 15, the film formation was conducted by introducing $C_2H_4$ gas from the 105 bomb in place of the introduction of $GeH_4$ gas (Sample 6B).

The film forming conditions in this case are as follows:

| | |
|---|---|
| $SiH_4$ | 20 sccm |
| $C_2H_4$ | 5 sccm |
| $B_2H_6$ (1% $H_2$ dilution) | 3 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-SiC:O:H:B film of about 1.1 μm thickness was deposited on the quartz glass substrate. This film was confirmed to be amorphous by the electron beam diffraction.

After an aluminum comb-shaped electrode (gap length 200 μm) was vapor deposited in vacuo on the A-SiC:O:H:B film, the sample 6B was placed in a vacuum cryostat, and the dark electroconductivity (σd) was measured to obtain a value of $4 \times 10^{-12}$ s/cm. Also, as the result of the measurement of thermal electromotive force, P type conductivity was exhibited.

EXAMPLE 17

In Example 11, the film formation was conducted by introducing $Si_2H_6$ gas from the 103 bomb simultaneously with introduction of $SiH_4$ gas (Sample 7B).

The film forming conditions in this case are as follows:

| | |
|---|---|
| $SiH_4$ | 20 sccm |
| $Si_2H_6$ | 5 sccm |
| $B_2H_6$ (1% $H_2$ dilution) | 3 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Si:O:H:B film of about 5000 Å thickness was deposited on the quartz glass substrate. This film was confirmed to be amorphous by the electron beam diffraction.

After an aluminum comb-shaped electrode (gap length 200 μm) was vapor deposited in vacuo on the A-Si:O:H:B film, the sample 7B was placed in a vacuum cryostat, and the dark electroconductivity (σd) was measured to obtain a value of $8 \times 10^{-11}$ s/cm. Also, the result of the measurement of thermal electromotive force exhibited P type conductivity.

EXAMPLE 18

In Example 17, the film formation was conducted by introducing $N_2O_4$ gas from the 107 bomb in place of the introduction of $O_2$ gas (Sample 8B).

The film forming conditions in this case are as follows:

| | |
|---|---|
| $SiH_4$ | 20 sccm |
| $Si_2H_6$ | 5 sccm |
| $B_2H_6$ (1% $H_2$ dilution) | 3 sccm |
| $N_2O_4$ | 5 sccm |
| He | 40 sccm |
| Inner pressure | 100 mTorr |
| Substrate temperature | 300° C. |
| Distance between gas blowing outlet and | 3 cm |

-continued

| | |
|---|---|
| substrate | |

After gas blowing for 3 hours, an A-Si:N:O:H:B film of about 6500 Å thickness was deposited on the quartz glass substrate. This film was confirmed to be amorphous by the electron beam diffraction.

After an aluminum comb-shaped electrode (gap length 200 μm) was vapor deposited in vacuo on the A-Si:N:O:H:B film, the sample 8B was placed in a vacuum cryostat, and the dark electroconductivity (σd) was measured to obtain a value of $2\times10^{-12}$ s/cm. Also, the result of the measurement of thermal electromotive force exhibited P type.

EXAMPLE 19

In Example 11, the film formation was conducted by setting the substrate temperature at 600° C. (Sample 9B).

The film forming conditions in this case are as follows:

| | |
|---|---|
| $SiH_4$ | 20 sccm |
| $B_2H_6$ (1% $H_2$ dilution) | 2 sccm |
| $O_2$ | 2 sccm |
| He | 40 sccm |
| Inner pressure | 100 mTorr |
| Distance between gas blowing outlet and substrate | 3 cm |

After gas blowing for 3 hours, a Si:O:H:B film of about 400 Å thickness was deposited on the quartz glass substrate. When the deposited film was measured by the electron beam diffraction, diffraction peak of $SiO_2$ was observed to indicate that it was converted into a polycrystalline.

After an aluminum comb-shaped electrode (gap length 200 μm) was vapor deposited in vacuo on the poly-Si:O:H:B film, the sample 9B was placed in a vacuum cryostat, and the dark electroconductivity (σd) was measured to obtain a value of $8\times10^{-10}$ s/cm. From the measurement of thermal electromotive force, it was found to be P type conductive.

EXAMPLE 20

In Example 11, the film formation was conducted by introducing $PH_3$ gas (1% $H_2$ gas dilution) from the 104 bomb in place of the introduction of $B_2H_6$ gas (Sample 10B).

The film forming conditions in this case are as follows:

| | |
|---|---|
| $Si_2H_6$ | 20 sccm |
| $PH_3$ (1% $H_2$ gas dilution) | 2 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-Si:O:H:P film of about 5500 Å thickness was deposited on the quartz glass substrate. This film was confirmed to be amorphous by the electron beam diffraction.

After an aluminum comb-shaped electrode (gap length 200 μm) was vapor deposited in vacuo on the A-Si:O:H:P film, the sample 10B was placed in a vacuum cryostat, and the dark electroconductivity (σd) was measured to obtain a value of $\sigma d=1\times10^{-10}$ s/cm. The measurement result of thermal electromotive force exhibited N-type conductivity.

EXAMPLE 21

In Example 20, the film formation was conducted by introducing $SiH_4$ gas from the 101 bomb and $GeH_4$ gas from the 105 bomb in place of the introduction of $Si_2H_6$ gas (Sample 11B).

| | |
|---|---|
| $SiH_4$ | 20 sccm |
| $GeH_4$ | 5 sccm |
| $PH_3$ (1% $H_2$ gas dilution) | 3 sccm |
| $O_2$ | 5 sccm |
| He | 40 sccm |
| Inner pressure | 100 mTorr |
| Substrate temperature | 300° C. |
| Distance between gas blowing outlet and substrate | 3 cm |

After gas blowing for 3 hours, an A-SiGe:P:H:P film of about 6000 Å thickness was deposited on the quartz glass substrate. This film was confirmed to be amorphous by the electron beam diffraction.

After an aluminum comb-shaped electrode (gap length 200 μm) was vapor deposited in vacuo on the A-SiGe:O:H:P film, the sample 11B was placed in a vacuum cryostat, and the dark electroconductivity (σd) was measured to obtain a value of $\sigma d=2\times10^{-10}$ s/cm. Also, from the result of the measurement of thermal electromotive force, the deposited film was found to exhibit N type conductivity.

As can be seen from the detailed description and the respective examples as set forth above, according to the deposition film forming method of the present invention, deposited films having uniform physical properties over a large area can be obtained with easy management of film quality at the same time as achievement of energy saving. Also, it is possible to obtain easily films excellent in productivity, and bulk productivity, having high quality, and being excellent in physical properties such as electrical, optical, and semiconductor properties, etc.

What is claimed is:

1. A method for forming a deposited film on a substrate in a reaction space, comprising:

introducing into said reaction space (a) a gaseous starting material for the formation of a deposited film, said gaseous starting material being selected from the group consisting of straight chain silane compounds represented by the formula $Si_nH_{2n+2}$, wherein n is an integer of 1 to 8; $SiH_3SiH(SiH_3)SiH_2SiH_3$; and chain, germanium compounds represented by the formula $Ge_mH_{2m+2}$ wherein m is an interger of 1 to 5 and (b) a gaseous oxidizing agent, said gaseous oxidizing agent being selected from the group consisting of air, oxygen, ozone, $N_2O_4$,$N_2O_3$, $N_2O$, NO and $H_2O_2$, to form a mixture and effect chemical contact therebetween and thereby form a plurality of precursors including precursors in an excited state; and forming a deposited film on said substrate in said reaction space through a gas introducing conduit system without the use of external discharge energy with at least one of said precursors, said gas introducing conduit system including a plurality of coaxially aligned conduits each having an exit orifice with an outer conduit adapted to carry said gaseous oxidizing agent and at least one inner conduit adapted to carry said gaseous starting material, said coaxially aligned conduits extending into the film forming space such that the exit orifice of the inner conduit is set back from the exit orifice of the outer conduit to enable the gaseous oxidizing agent in the outer conduit to surround the gaseous starting material exiting said inner conduit, said substrate positioned from 5 millimeters to 15 centimeters from the exit orifice of said outer conduit.

2. A method for forming a deposited film according to claim 1, wherein said gaseous starting material is a straight chain silane compound.

3. A method for forming a deposited film according to claim 1, wherein said gaseous starting material is a chain germanium compound.

4. A method for forming a deposited film according to claim 1, wherein said gaseous oxidizing agent is an oxygen compound.

5. A method for forming a deposited film according to claim 1, wherein said gaseous oxidizing agent is an oxygen gas.

6. A method for forming a deposited film according to claim 1, wherein said gaseous oxidizing agent is a nitrogen compound.

7. A method for forming a deposited film according to claim 1, wherein said substrate is arranged at a position opposed to the direction in which said gaseous starting material and said gaseous oxidizing agent are introduced into said reaction space.

8. A method for forming a deposited film according to claim 1, wherein luminescence accompanies said formation of a deposited film.

9. A method for forming a deposited film according to claim 1, wherein gaseous starting material is $SiH_3$-$SiH(SiH_3)SiH_2SiH_3$.

10. A method for forming a deposited film on a substrate in a reaction space, comprising;

introducing into said reaction space (a) a gaseous starting material for the formation of a deposited film, (b) gaseous oxidizing agent having an oxidation effect on said starting material, and (c) a gaseous material containing a valence electron controller component, said gaseous oxidizing agent being selected from the group consisting of air, oxygen, ozone, $N_2O_4$, $N_2O_3$, $N_2O$, NO and $H_2O_2$, to form a mixture and effect chemical contact therebetween and thereby form a plurality of precursors including precursors in an excited state; and forming a deposited film on said substrate in said reaction space through a gas introducing conduit system without the use of external discharge energy with at least one of said precursors, said gas introducing conduit system including a plurality of coaxially aligned conduits each having an exit orifice with an outer conduit adapted to carry said gaseous oxidizing agent, at least one inner conduit adapted to carry said gaseous starting material, and at least one inner conduit adapted to carry said valence election controller, said coaxially aligned conduits extending into the film forming space such that the exit orifice of the inner conduit is set back from the exit orifice of the outer conduit to enable the gaseous oxidizing agent in the outer conduit to surround the gaseous starting material exiting said inner conduit, said substrate positioned from 5 milimeters to 15 centimeters from the exit orifice of said outer conduit.

11. A method for forming a deposited film according to claim 10, wherein said gaseous starting material is a chain silane compound.

12. A method for forming a deposited film according to claim 11, wherein said chain silane compound is a straight chain silane compound.

13. A method for forming a deposited film according to claim 12, wherein said straight chain silane compound is represented by the formula $Si_nH_{2n+2}$ wherein n is an integer of 1 to 8.

14. A method for forming a deposited film according to claim 11, wherein said chain silane compound is a branched chain silane compound.

15. A method for forming a deposited film according to claim 10, wherein said gaseous starting material is a silane compound having a cyclic structure of silicon.

16. A method for forming a deposited film according to claim 10, wherein said gaseous starting material is a chain germanium compound.

17. A method for, forming a deposited film according to claim 16, wherein said chain germanium compound is represented by the formula $Ge_mH_{2m+2}$ wherein m is an integer of 1 to 5.

18. A method for forming a deposited film according to claim 10, wherein said gaseous starting material is a hydrogenated tin compound.

19. A method for forming a deposited film according to claim 10, wherein said gaseous starting material is a tetrahedral type compound.

20. A method for forming a deposited film according to claim 10, wherein said gaseous oxidizing agent is an oxygen compound.

21. A method for forming a deposited film according to claim 10, wherein said gaseous oxidizing agent is an oxygen gas.

22. A method for forming a deposited film according to claim 10, wherein said gaseous oxidizing agent is a nitrogen compound.

23. A method for forming a deposited film according to claim 10, wherein said substrate is arranged at a position opposed to the direction in which said gaseous starting material, said gaseous oxidizing agent, and said gaseous valence controller material are introduced into said reaction space.

24. A method for forming a deposited film according to claim 10, wherein luminescence accompanies said formation of a deposited film.

* * * * *